United States Patent [19]
Kim et al.

[11] Patent Number: 6,119,253
[45] Date of Patent: Sep. 12, 2000

[54] METHOD AND DEVICE FOR SETTING A PLURALITY OF TEST MODES USING EXTERNAL PINS

[75] Inventors: Won-kyum Kim, Suwon; Kwang-jae Jung, Seoul, both of Rep. of Korea

[73] Assignee: Samsung Electronics, Co., Ltd., Suwon, Rep. of Korea

[21] Appl. No.: 08/953,055

[22] Filed: Oct. 17, 1997

[30] Foreign Application Priority Data

Oct. 18, 1996 [KR] Rep. of Korea ................ 96/46842

[51] Int. Cl.$^7$ .................................... G01R 31/28
[52] U.S. Cl. .................. 714/724; 324/763; 324/765
[58] Field of Search .................... 714/718, 722, 714/724, 733, 30, 725, 734; 365/201; 324/763, 765

[56] References Cited

U.S. PATENT DOCUMENTS

| | | | |
|---|---|---|---|
| 5,198,758 | 3/1993 | Iknaian et al. | 324/158 |
| 5,406,567 | 4/1995 | Ogawa | 371/22.1 |
| 5,528,162 | 6/1996 | Sato | 324/765 |
| 5,732,209 | 3/1998 | Vigil et al. | 395/183.06 |

*Primary Examiner*—Albert De Cady
*Assistant Examiner*—Esaw Abraham
*Attorney, Agent, or Firm*—Marger Johnson & McCollom, P.C.

[57] ABSTRACT

A method for setting test modes in a semiconductor ship and a device suitable for the method are provided. In the method, a power voltage is externally applied to the semiconductor chip. A predetermined signal is applied to an arbitrary selected external pin of the semiconductor chip. A first-state signal is applied to the test pin and a second-state signal is applied to the test pin a predetermined time later. The signal applied to the external pin is latched by the first-state signal applied to the test pin. The second-state signal applied to the test pin, a predetermined signal output when the first-state signal applied to the test pin is shifted to the second-state signal, and the latched signal are logically combined and the combined signal is output.

10 Claims, 4 Drawing Sheets

METHOD AND DEVICE FOR SETTING A PLURALITY OF TEST MODES USING EXTERNAL PINS

FIELD OF THE INVENTION

The present invention relates to a method for setting a test mode for a semiconductor chip and a method therefor, and more particularly, to a method and device for setting a plurality of test modes, using lead frame terminals, also called external pins.

BACKGROUND OF THE INVENTION

For operation of a semiconductor chip, it is installed in a lead frame having leads to connect the chip via its lead frame terminals (or external pins) to external circuits. Prior to installation and/or after installation in the lead frame, a microprocessor chip is tested as to whether the microprocessor chip operates normally and meets the specification of a product for which the microprocessor chip is used. That is, a plurality of test modes are required when different test conditions are needed to test whether, for example, a CPU, a RAM or peripheral devices of the microprocessor operates normally, when a program stored in an internal or external ROM is normally performed, or when read/write operations are normally performed.

In fabricating a semiconductor integrated circuit chips, it is difficult for a manufacturer to allocate a plurality of test pins because as the number of test pins increases, manufacture cost increases accordingly. Moreover, even when a plurality of test pins are allocated, they become useless after the tests are performed. Thus, the manufacturer tries to reduce the number of test pins and thus limits the number of possible test modes. In general, a single pin is allocated for a test, and a test mode is set by applying a logic high signal or a logic low signal.

In addition to being constrained by such limited test modes, the prior art has another disadvantage that it is influenced by process parameters because a test mode is set by changing a high level.

SUMMARY OF THE INVENTION

To solve the above problems, it is an object of the present invention to provide a device and method for setting a plurality of test modes, using a test pin and every external pin.

To achieve the above object, a method for setting a plurality of test modes according to the present invention, provides for externally applying a power voltage to a semiconductor chip having a test pin and a predetermined signal to an arbitrarily selected external pin of the semiconductor chip (generally excluding clock input pins and power supply pins). More specifically, a first-state signal is applied to the test pin and a second-state signal is applied to the test pin a predetermined time later. The signal applied to the external pin is latched by the first-state signal applied to the test pin. The second-state signal applied to the test pin, a predetermined signal output when the first-state signal applied to the test pin is shifted to the second-state signal, and the latched signal are logically combined and the combined signal is output. The method of the present invention further comprises the step of encoding the output signal.

To achieve another object, a device for setting a plurality of test modes using external pins excluding a test pin, a power supply pin, and a clock supply pin, according to the present invention, includes transmission gate, flip-flop, and NOR-gate, or the equivalents thereof. The transmission gate controls the transmission of a signal applied to a predetermined number of external pins according to the state of a signal applied to the test pin. The flip-flop combines a logic high output signal of an external power source with the signal applied to the test pin, and determines an output. The NOR-gate gates the received output signals from the transmission gate, the test pin, and the flip-flop.

The device of the present invention further includes a latch for latching the signal output from the transmission gate and outputting the latched signal to a terminal of the NOR-gate. The device of the present invention further comprises an encoder for encoding the output signal of the NOR-gate.

BRIEF DESCRIPTION OF THE DRAWINGS

The above objects and advantages of the present invention will become more apparent by describing in detail preferred embodiments thereof with reference to the attached drawings in which.

DESCRIPTION OF THE PREFERRED EMBODIMENTS

Figure 1:
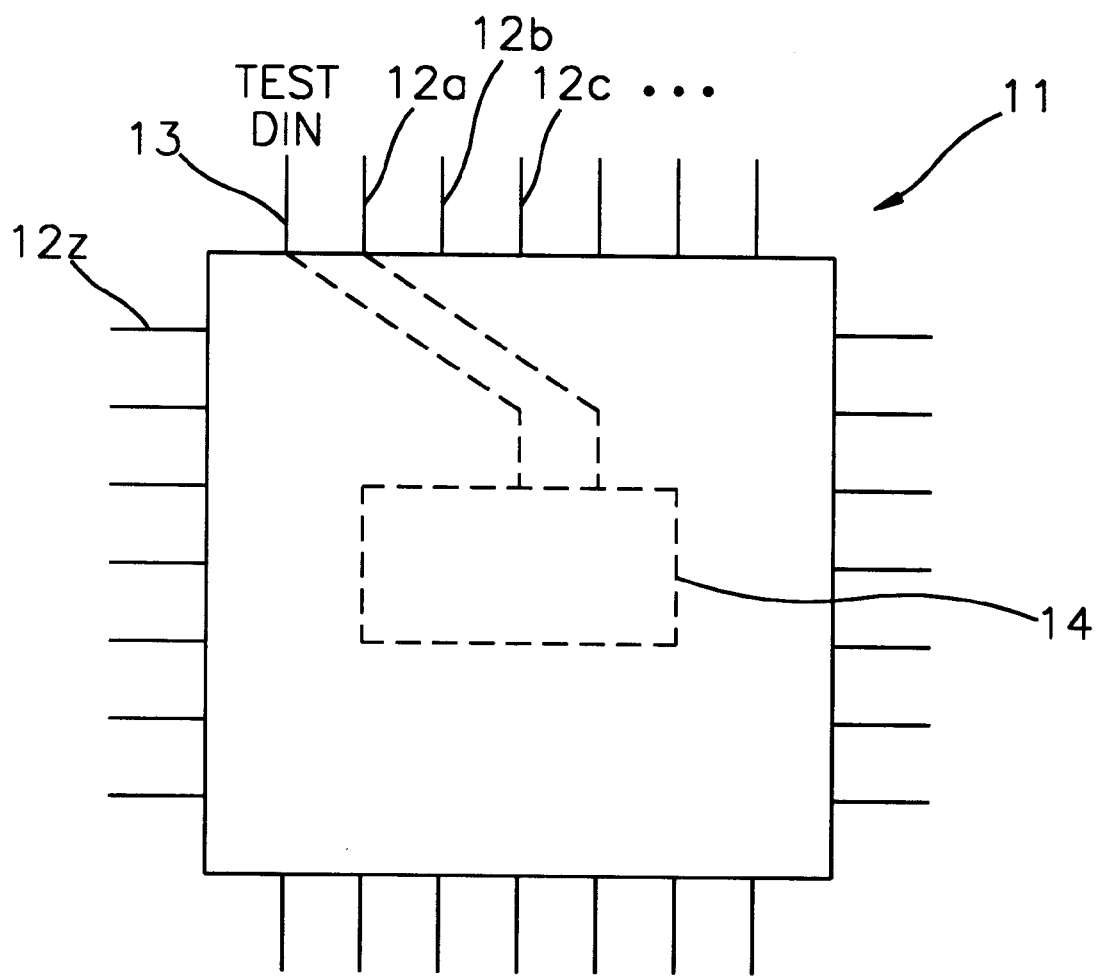
FIG. 1 is a block diagram of semiconductor chip having a plurality of external pins, a single test pin and testing circuit in accordance with this invention.

This invention provides a device and method for setting a plurality of test modes in a semiconductor chip with a single test pin on a semiconductor chip, a plurality of external pins on the semiconductor chip and a circuit which operates to provide testing of particular chip functions with respect to each one of the plurality of external pins. With this invention a plurality of test modes are possible when the circuit is in communication with the single test pin and arbitrarily selected external pins. Referring to FIG. 1, a block diagram provides an overall picture of this invention by illustrating a chip 11, a plurality of external pins, 12a–z, a single test pin 13 and a circuit in phantom 14 in communication with one of the external pins and the test pin. The circuit 14 on chip 11 is in phantom to illustrate that it is just one of any number of circuits on chip 11. Below, referring to FIG. 2, specific steps for a method to carry out this invention are described. Then referring to FIG. 3, a circuit diagram shows components which operate to carry out the above described invention.

Figure 2:
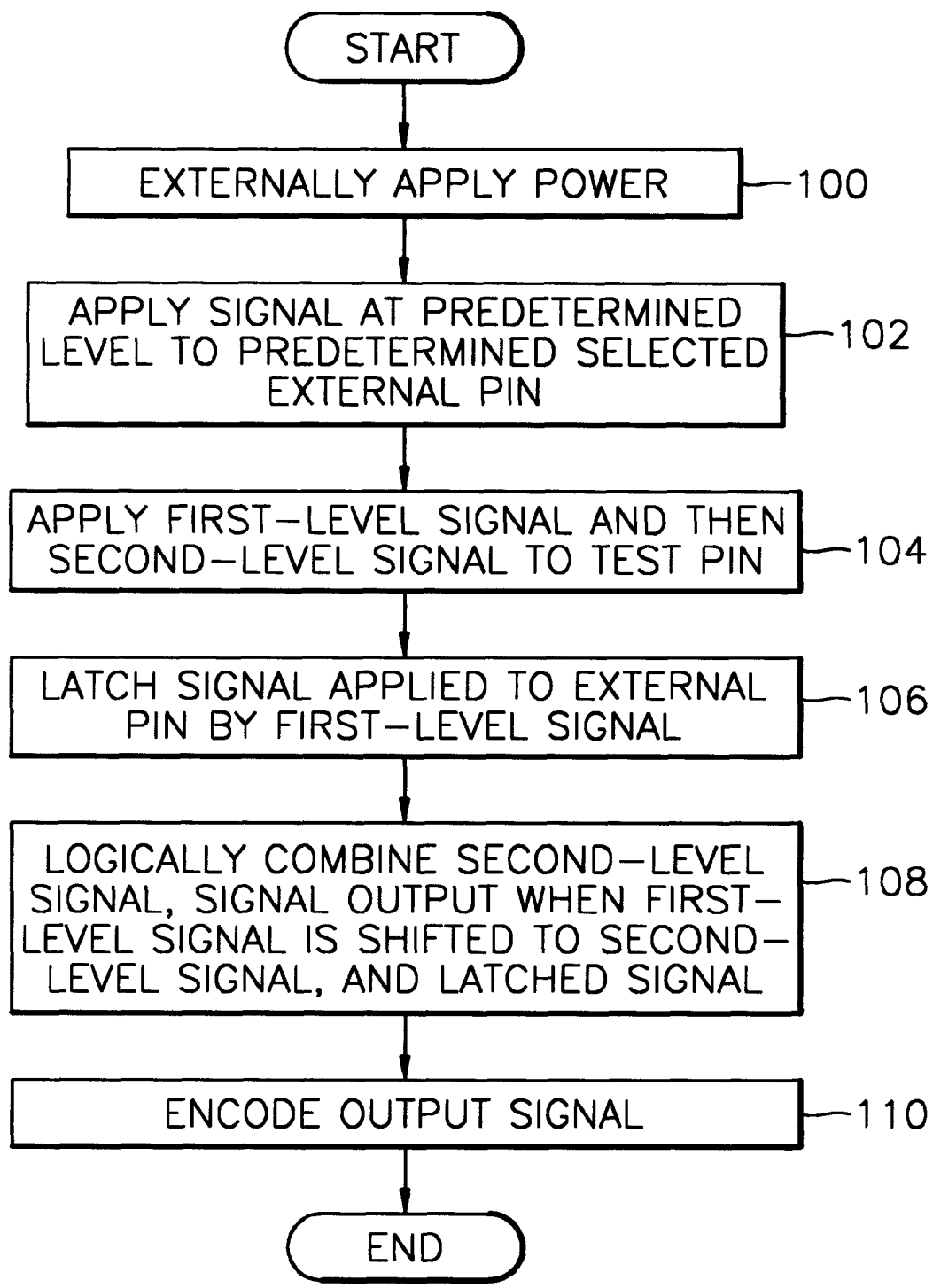
FIG. 2 is a flowchart of the steps of a method for setting a plurality of test modes, using external pins, according to the present invention.

Referring to FIG. 2, a method for setting a plurality of test modes, using arbitrarily selected external pins and a single test pin is described. The selection of the external pin is determined by the function to be tested. An arbitrarily selected external pin generally refers to any external pin except for the clock or power source.

In step 100, power is externally applied to a semidconductor chip. In step 102, at least one arbitrarily selected external pin (e.g. pin 12a) is selected from the semiconductor chip 11 and predetermined signal is applied to the selected pin. In step 104, a signal of a first state is applied to the test pin 13 and, a predetermined time later (of sufficient duration), a signal of a second state is applied to the test pin. Here, the first-state signal and the second-state signal are logic high and low, respectively.

In step 106, the signal applied to the external pin is latched by the first-state signal applied to the test pin. In step 108, the second-state signal applied to the test pin, a predetermined signal output when the first-state signal applied to the test pin is shifted to the second-state signal, and the latched signal are logically combined, and output.

In step 110, the signal output from step 108 is received and encoded, thereby setting a plurality of test modes. Here, test modes which can be set are determined by the number n of selected external pins, and therefore the number of the set test modes is $2^n$.

Figure 3:
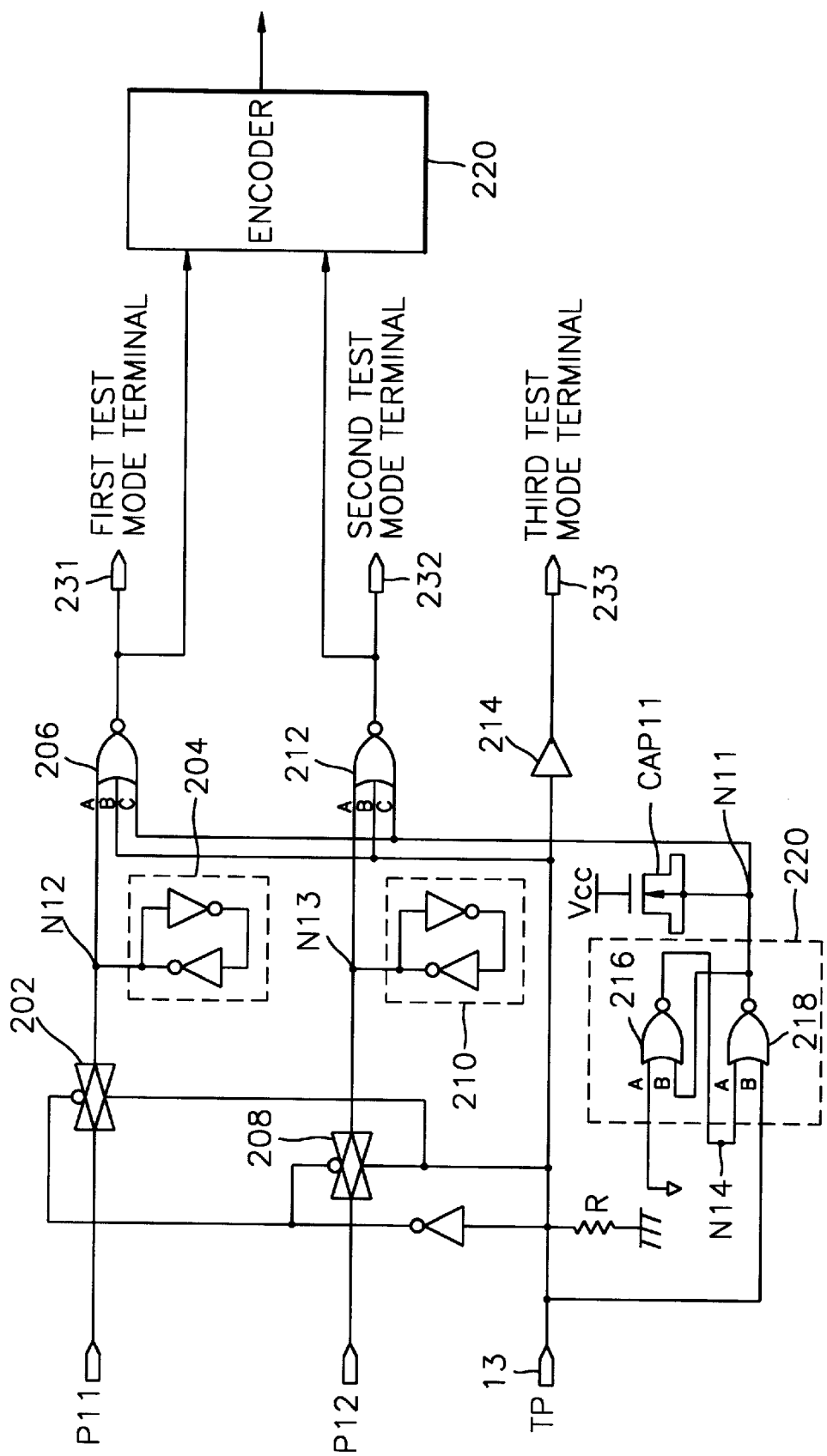
FIG. 3 is a circuit diagram of a device for setting a plurality of test modes, using external pins, according to the present invention.

FIG. 3 illustrates an example of a device for setting a plurality of test modes according to the present invention. Here, a single test pin 13 and two external pins P11 and P12 are shown.

Referring to FIG. 3, pins P11 and P12 are external pins used for their original functions in the first instance, and then in combination with the test pin 13 for testing in the second instance. In addition, first through third test mode termninals 231, 232 and 233 are positioned inside a chip. Signals which are obtained by logically combining the signal of the test pin 13 and the flip-flopped signal thereof with the signals of pins P11 and P12 are applied to the second and third test mode terminals, 232 and 233, respectively. A plurality of intended test modes can be set by encoding these applied signals. Further, pins P11 and P12 are used to set test modes, and serve their original purposes again after testing.

The device of FIG. 3 includes transmidssion gates 202 and 208 for controlling transmission of signals applied to external pins P11 and P12 according to the state of a signal applied to the test pin 13, latches 204 and 210 for latching signals output from the transmission gates 202 and 108, a flip-flop 220 for combining a logic high output signal of an external power source VCC with the signal applied to the test pin, and determining an output, NOR gates 206 and 212 for receiving the output signals of the latches 204 and 210, the signal applied to the test pin, and the output signal of the flip-flop 220, and NOR-gating them, and an encoder 220 for receiving the output signals of the NOR gates 206 and 212 and encoding them.

Here, the flip-flop 220 includes two NOR gates 216 and 218. The output of the flip-flop 220 experiences no variation even though the signal applied to the test pin is shifted from logic high to logic low after an external voltage VCC is applied to the flip-flop 220. In addition, a capacitor CAP11 is used to apply a stable voltage to the flip-flop 220. That is, with application of the external voltage VCC as a logic high level, node 11 N11 is set at a logic high level, a signal of node 11 is input to a terminal B of the NOR gate 216, and thus node 14 N14 has a logic low signal. The logic low signal of the node 14 and the logic high signal applied to the test pin are input to the NOR gate 218, and the output of the NOR gate 118 is kept at a logic low level. Here, even though the signal applied to the test pin is shifted to logic low, the output of the NOR gate 118 is kept logic low.

Figure 4A:
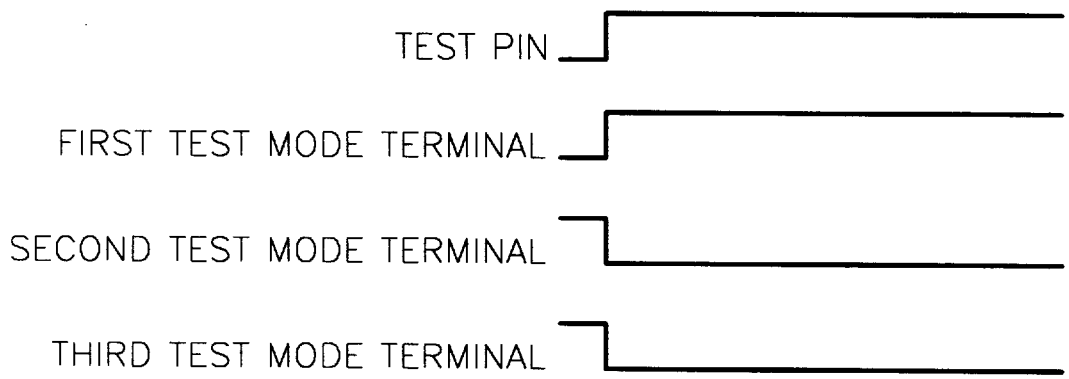
FIGS. 4A through 4C illustrate the waveforms of signals for explaining the operation of the device shown in FIG. 3.
Figure 4B:
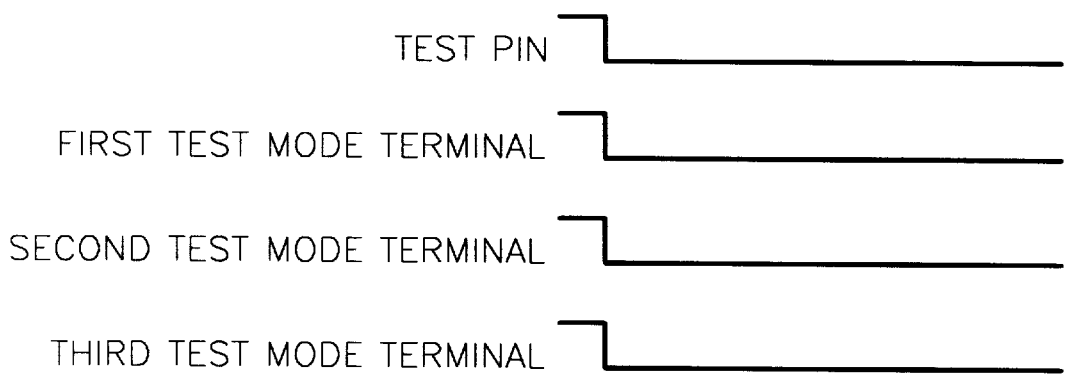
Figure 4C:
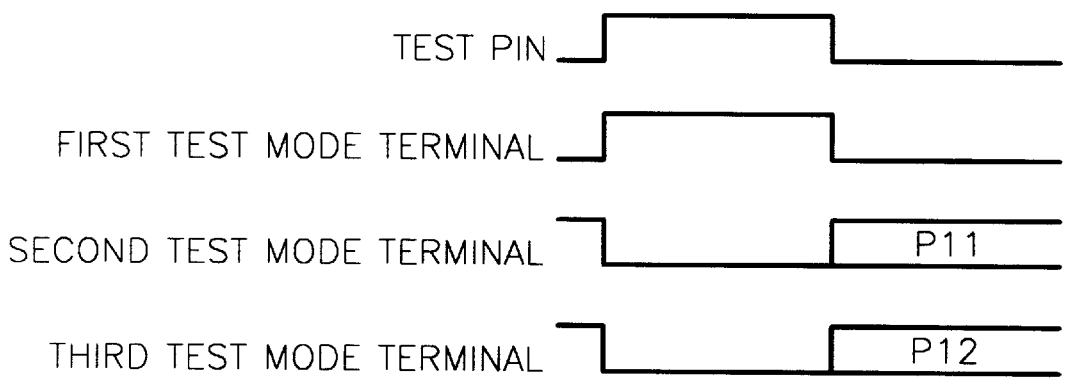

FIGS. 4A through 4C illustrate the waveforms of signals, for explaining the operation of the device shown in FIG. 3.

As shown in FIG. 4A, when a logic high signal is applied to the test pin and the power supply voltage VCC is supplied, a signal is kept at a logic high level in a buffer 214, and thus a logic high signal is applied to the first test mode terminal. Meanwhile, when a power voltage stabilized by the capacitor CAP11 is applied to the flip-flop 220, the output signal of the flip-flop 220 becomes logic low, but the transmission gates 202 and 208 are disabled. Therefore, no signals are output to the second and third test mode terminals, in which a logic high signal is applied to the first test mode terminal and pins P11 and P12 are used for their original purposes.

FIG. 4B illustrates the waveforms of signals when a logic low signal is applied to the test pin. When the logic low signal and then the power voltage VCC are applied, a logic low signal is applied to the first test mode terminal. Meanwhile, when a power voltage stabilized by the capacitor CAP 11 is applied to the flip-flop 220, the output signal of the flip-flop 220 becomes logic high. No signals are output to the second and third test mode terminals. Therefore, in this case, a logic low signal is applied to the first test mode terminal, and pins P11 and P12 are used for their original purposes. Here, it is preferable that a user not apply a logic high signal to the test pin during the operation of a chip, and should ground the test pin in terms of hardware. However, to prevent the test pin from being set to a logic high level due to noise and thus shifting node 11 from logic high to logic low, a noise filter (not shown) may be installed between the test pin and the buffer 214. As long as a logic low signal applied to the test pin is stabilized, the noise filter is not necessarily needed.

As described above, when a signal is initially applied at a logic high level to the test pin, the logic high signal applied to the first test mode terminal is used to write or read a program in or from an EPROM and an EEPROM or other suitable circuit.

FIG. 4C illustrates the waveforms of signals, for explaining the case that the signals applied to the pins P11 and P12 are inverted and the inverted results are applied to the second and third test mode terminals by applying a signal at a logic high level to the test pin for a predetermined time and then shifting the signal to a logic low level. In this case, a designer may further provide an inverter so that the same signals as those applied to pins 11 and 12 are applied to the second and third test mode terminals, according to test purposes.

First, if power is applied, signals are applied at predetermined levels to P11 and P12, and a logic high signal is applied to the test pin for a predetermined time, the signals applied to P11 and P12 are latched by the latches 204 and 214 by means of this logic high signal, and the output of the flip-flop 220 is kept logic low. The predetermined levels refer to signals of high or level applied to the external pins P11 and P12 and such a state is determined by the designer according to a desired test mode.

When a logic low signal is applied to the test pin a predetermined time later, the transmission gates 202 and 208 are off, and node 11 is kept logic low. Thus, the signals applied to P11 and P12 and stored in the latches 204 and 210 are inverted by the output signals of the NOR gates 206 and 212 and transmitted to the second and third test modes, respectively.

As described above, the signal transmitted to each test mode terminal may be directly used as an internal test signal, or may be encoded to realize $2^N$ test modes in which N is the number of the selected external pins. This invention provides a manner in which external pins may be used in conjunction with a test pin for testing particular functions of the semiconductor chip. This invention is not limited to a single test pin used with all of the other external pins on a semiconductor chip in that design requirements may dictate the use of more than one test pin. In the method and device for setting a plurality of test modes using external pins according to the present invention, a plurality of test modes can be set.

What is claimed is:

1. A method for setting a plurality of test modes in a semiconductor chip having a test pin, comprising the steps of:

externally applying a power voltage to the semiconductor chip;

applying a predetermined signal to an arbitrary selected external pin of the semiconductor chip;

applying a first-state signal to the test pin and applying a second-state signal to the test pin a predetermined time later;

latching the signal applied to the external pin by the first-state signal applied to the test pin; and logically combining the second-state signal applied to the test pin, a predetermined signal output when the first-state signal applied to the test pin is shifted to the second-state signal, and the latched signal, and outputting the combined signal.

2. The method of claim 1, further comprising the step of encoding the output signal.

3. The method of claim 1, wherein the first-state signal and the second-state signal are logic high and logic low, respectively.

4. A device for setting a plurality of test modes using external pins and a test pin on a semiconductor chip, comprising:

transmission gate means for controlling the transmission of a signal applied at a predetermined state to a predetermined number of external pins according to the state of a signal applied to the test pin;

flip-flop means for combining a logic high output signal of an external power source with the signal applied to the test pin, and determining an output; and NOR-gate means for NOR-gating the received output signals from the transmission means, the test pin, and the flip-flop means.

5. The device of claim 4, further comprising latch means for latching the signal output from the transmission gate means and outputting the latched signal to a terminal of the NOR-gate means.

6. The device of claim 5, further comprising an encoder for encoding the output signal of the NOR-gate means.

7. The device of claim 6, wherein a logic high signal is applied to the test pin and, a predetermined time later, a logic low signal is applied to the test pin.

8. A device for setting a plurality of test modes in a semiconductor chip having a test pin, comprising:

means for externally applying a power voltage to the semiconductor chip;

means for applying a predetermined signal to an arbitrary selected external pin of the semiconductor chip;

means for applying a first-state signal to the test pin and applying a second-state signal to the test pin a predetermined time later;

means for latching the signal applied to the external pin by the first-state signal applied to the test pin; and means for logically combining the second-state signal applied to the test pin, a predetermined signal output when the first-state signal applied to the test pin is shifted to the second-state signal, and the latched signal, and outputting the combined signal.

9. The device of claim 8, further comprising:

means for encoding the output signal.

10. The device of claim 8, wherein the first-state signal and the second-state signal are logic high and logic low, respectively.

* * * * *